(12) United States Patent
Bang

(10) Patent No.: US 12,588,387 B2
(45) Date of Patent: Mar. 24, 2026

(54) DISPLAY APPARATUS

(71) Applicant: LG DISPLAY CO., LTD., Seoul (KR)

(72) Inventor: Giho Bang, Gyeonggi-do (KR)

(73) Assignee: LG Display Co., Ltd (KR)

( * ) Notice: Subject to any disclaimer, the term of this patent is extended or adjusted under 35 U.S.C. 154(b) by 502 days.

(21) Appl. No.: 17/985,962

(22) Filed: Nov. 14, 2022

(65) Prior Publication Data

US 2023/0200182 A1     Jun. 22, 2023

(30) Foreign Application Priority Data

Dec. 20, 2021     (KR) ........................ 10-2021-0183228

(51) Int. Cl.
| | |
|---|---|
| *H10K 59/40* | (2023.01) |
| *G06F 3/041* | (2006.01) |
| *H10K 59/124* | (2023.01) |
| *H10K 59/80* | (2023.01) |

(52) U.S. Cl.
CPC .......... *H10K 59/40* (2023.02); *H10K 59/873* (2023.02); *G06F 3/0416* (2013.01); *H10K 59/124* (2023.02)

(58) Field of Classification Search
CPC .. H10K 50/844; H10K 59/124; H10K 59/131; H10K 59/40; H10K 59/873; G06F 3/0412; G06F 3/0416; G06F 3/0446
See application file for complete search history.

(56) References Cited

U.S. PATENT DOCUMENTS

| | | | | |
|---|---|---|---|---|
| 2020/0379595 A1* | 12/2020 | Kim | ...................... | H10K 59/131 |
| 2021/0210713 A1* | 7/2021 | Li | ......................... | H10K 59/122 |
| 2022/0129098 A1* | 4/2022 | Hu | ......................... | G06F 3/0443 |
| 2022/0130937 A1* | 4/2022 | Zhao | ................... | H10K 59/131 |
| 2022/0246880 A1* | 8/2022 | Jeong | .................. | H10K 59/873 |
| 2024/0188353 A1* | 6/2024 | Zhang | ................. | H10K 59/122 |
| 2025/0081762 A1* | 3/2025 | Shang | ................ | G06F 3/04164 |

FOREIGN PATENT DOCUMENTS

| | | |
|---|---|---|
| CN | 107871764 A | 4/2018 |
| CN | 113224107 A | 8/2021 |
| CN | 113345935 A | 9/2021 |
| KR | 20200105574 A | 9/2020 |
| KR | 20200138544 A | 12/2020 |
| KR | 20210052953 A | 5/2021 |

OTHER PUBLICATIONS

Office Action in Korean Appln. No. 10-2021-0183228, mailed on Sep. 16, 2025, 9 pages (with English translation).
Office Action in Chinese Appln. No. 202211601245.0, mailed on Dec. 31, 2025, 15 pages (with English translation).

* cited by examiner

*Primary Examiner* — Shaun M Campbell
(74) *Attorney, Agent, or Firm* — Fish & Richardson P.C.

(57) ABSTRACT

A display apparatus includes a substrate including a display area, a camera hole, and a non-display area between the display area and the camera hole, at least one cut-out part and at least one dam disposed in the non-display area, a plurality of insulating films disposed on the substrate and disposed under a light-emitting element, the cut-out part, and the dam, and a crack detection unit disposed between the at least one cut-out part and the camera hole.

12 Claims, 8 Drawing Sheets

DISPLAY APPARATUS

CROSS-REFERENCE TO RELATED APPLICATION

This application claims the priority of Korean Patent Application No. 10-2021-0183228, filed on Dec. 20, 2021, which is hereby incorporated by reference in its entirety.

BACKGROUND

Field of the Disclosure

The present disclosure relates to a display apparatus, and more particularly, to a display apparatus in which a camera hole is disposed.

Description of the Background

Recently, as the information age has arrived, displays visually expressing electrical information signals have been rapidly developed. In response to such a trend, various display apparatuses having excellent performance, such as a thin profile, a light weight, and low power consumption, have been developed.

Specific examples of such display apparatuses include a liquid crystal display (LCD) apparatus, an organic light-emitting diode (OLED) display apparatus, and a quantum dot display apparatus.

A display apparatus may include a display panel and a plurality of components for providing various functions. For example, in an existing display apparatus, cameras and various optical sensors are disposed at a peripheral portion of a display panel to perform various functions such as photographing, face recognition, and infrared distance measurement functions. However, through successive generations, so-called bezel-less or bezel-free designs, in which a screen is fully filled with a display area when a user looks at the display apparatus, have become more common, which makes it difficult to arrange such cameras and optical sensors. In order to achieve such a bezel-less or bezel-free design, research has been conducted on a method of moving cameras and optical sensors inside a display area of a display panel. As a result of the research, a technology called a hole-in display (HID) has been developed in which holes can be formed in a display panel to arrange cameras and optical sensors inside the holes in a display panel.

Although an HID has been described above in order to express that a hole is present in a display area, a hole-in active area (HiAA) may also be used in order to express that a hole is present inside an active area.

As an HID or an HiAA is developed and all cameras and sensors placed in the existing bezel area are moved to the inside of an active area of a display panel, extreme bezel-less or bezel-free designs can be applied.

A display area and an active area may be synonymous to describe area in which a pixel is driven to emit light.

SUMMARY

The present disclosure is directed to solving the above-described problems that may occur in designing a hole-in display (HID) or hole-in active area (HiAA) structure.

Holes in which cameras or optical sensors are disposed may be formed in a display area or an active area. In this case, components such as a light-emitting element or a driving transistor required for a display may not be disposed in a hole area, and even a substrate of a display panel may be removed from the hole area. When the substrate of the display panel or the light-emitting element remains in the hole area, optical interference on cameras or sensors may occur, and thus, a function thereof may be degraded.

As described above, in order to remove the substrate of the display panel, a fine cutting process may be generally performed using a laser. When cutting is performed based on a phenomenon in which the substrate of the display panel is melted and broken by local thermal energy received from the laser, a large amount of energy may be accumulated in a local area of the substrate, and cracks may be generated due to the energy accumulated in the substrate at the time of a cutting process or after the cutting process.

Cracks generated in a cut portion of the substrate may expand or extend to a peripheral area due to stress generated as a subsequent process is performed. Specifically, the cracks generated in the cut portion of the substrate may expand or extend toward a display area, and in particular, the cracks may easily propagate in an inorganic insulating film disposed near the hole area.

Cracks generated in the cut portion of the substrate in the hole area, which may be regarded as the outside of the display area, may become a kind of moisture penetration path. Light-emitting element disposed in the display area are provided with an organic material layer or an organic emission layer and thus have a characteristic vulnerable to moisture.

Specifically, when moisture permeates into the organic material layer of the light-emitting element, an organic material reacts with the moisture to cause pixel shrinkage in which an emission area is gradually reduced or a dark spot phenomenon in which a pixel does not emit light completely. If a display panel, in which the pixel shrinkage or dark spot phenomenon occurs due to penetration of moisture through a camera hole area, is used in a finished display apparatus, the finished display apparatus cannot be sold. When such a defective panel can be sorted and separated in a manufacturing process before a display apparatus is completely finished, for example, since a module process for completely finishing the display apparatus needs not to be performed, unnecessary processes and use of parts can be reduced.

To this end, after a cutting process of a camera hole area, a process of inspecting whether cracks are generated in a corresponding area may be performed. By adding a process of checking whether cracks are generated, it is possible to reduce costs due to a subsequent process being performed and prevent a decrease in products.

A main point of the present disclosure is that, in order to design a bezel-less or bezel-free display panel which is a development trend of display apparatuses, holes for arranging camera and sensors in a display area are formed, and also, defective products are prevented from being produced due to the holes.

In an aspect of the present disclosure, a display apparatus includes a substrate including a display area, a camera hole, and a non-display area between the display area and the camera hole, at least one cut-out part and at least one dam disposed in the non-display area, a plurality of insulating films disposed on the substrate and disposed under a light-emitting element, the cut-out part, and the dam, and a crack detection unit disposed between the at least one cut-out part and the camera hole.

In another aspect of the present disclosure, a display apparatus includes a substrate including a non-display area disposed between a camera hole and a display area, a touch sensor unit disposed to correspond to the display area, a touch crack detection electrode disposed to correspond to the non-display area, and a crack detection unit disposed to correspond to the non-display area.

Other detailed matters of the aspects are included in the detailed description and the drawings.

In a display apparatus according to various aspects of the present disclosure, a camera hole can be disposed inside a display area of a display panel, thereby providing a display apparatus in which an overall exterior of a display panel has a slim bezel or a narrow bezel.

Therefore, a user of a display apparatus can aesthetically use a device in which a front surface of a display apparatus is fully with a light-emitting screen, and by using a compact module that is functionally applied to a narrow bezel, a better sense of grip and a sense of light weight can be provided to the user.

In a display apparatus according to various aspects of the present disclosure, a crack detection structure is formed around a camera hole, thereby detecting cracks, which can be generated from the camera hole, to check a display panel, into which moisture and oxygen has permeated or are to permeate, in advance. A crack detection structure installed at an outer peripheral portion of a display panel can be formed, for example, at upper, lower, left, and right edges of a display area to check the penetration of cracks that can be generated in a manufacturing process. In addition, it is necessary to check the penetration of cracks that can be generated even near a camera hole disposed inside a display area, which has the same purpose as the crack detection structure disposed at the upper, lower, left, and right edges of the display area.

A prevention structure for preventing the propagation of moisture or oxygen can be provided near a camera hole. The prevention structure can block a movement path of moisture and oxygen by cutting off a connection of an organic common layer of a light-emitting element disposed on an entire surface of a display panel, that is, a light-emitting stack.

With reference to the straightness of an organic material in an organic material deposition process for forming a light-emitting stack, a vertical structure of the prevention structure can be increased to form a long side portion, or a width of the side portion of the prevention structure can be varied. An organic material is not stacked or is inevitably stacked non-uniformly on an area, which is not present in a deposition direction of the organic material through the side portion of the prevention structure, or on the side portion perpendicular to the deposition direction. Thus, a material constituting the light-emitting stack can not be stacked on the side portion of the prevention structure or can be non-uniformly stacked and thus structurally separated.

A plurality of dams are disposed near the prevention structure, thereby preventing an organic insulating layer of an encapsulation layer from overflowing into a camera hole. Through the plurality of dams, it is possible to prevent contamination of a camera hole area that can occur when the organic insulating layer overflows to the camera hole and prevent interference on a camera to be disposed in the camera hole area. In addition, through the plurality of dams, at least some of cracks that can occur in the camera hole can be absorbed.

Prevention structures are disposed at a plurality of positions, thereby preventing penetration of moisture and oxygen from a camera hole, and the prevention structures are formed in different shapes such as a positive tapered shape and a negative tapered shape to use the pros and cons of each structure, thereby obtaining more excellent effects of preventing moisture penetration and oxygen permeation.

Through a combination of prevention structures, a crack detection structure allows the permeation of moisture to be more effectively prevented and allows the generation and propagation of cracks to be checked. The crack detection structure is disposed between the prevention structures and adjacent to a camera hole, thereby early checking the propagation of cracks.

The effects of the present disclosure are not limited to the above-described effects, and other effects, which are not described above, will be apparent to a person having ordinary skill in the art from the following description.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Figure 1:
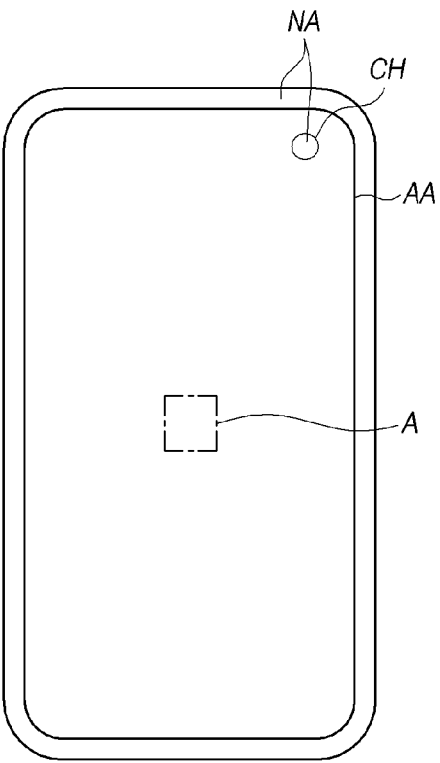
FIG. 1 is a view illustrating a front surface of a display panel according to an aspect of the present disclosure.

The advantages and features of the present disclosure and methods for accomplishing the same will be more clearly understood from aspects to be described in detail below with reference to the accompanying drawings. However, the present disclosure is not limited to the following aspects but may be implemented in various different forms. The present aspects are provided only to complete the present disclosure and to fully provide the scope of the present disclosure to a person having ordinary skill in the art to which the present disclosure pertains, and the present disclosure will be defined by the appended claims.

Shapes, sizes, ratios, angles, and numbers disclosed in the drawings for describing the aspects of the present disclosure are merely examples, and thus, the present disclosure is not limited to the illustrated details. Like reference numerals refer to like elements throughout. In describing the present disclosure, when the detailed description of the relevant known function or configuration is determined to unnecessarily obscure an important point of the present disclosure, the detailed description will be omitted. In a case where "comprise," "have," and "include" described in the present disclosure are used, another part may be added unless "only" is used. Any references to singular may include plural unless expressly stated otherwise.

In construing a component, the component is construed as including an error range even if there is no explicit description.

In describing a position relationship, for example, when a position relation between two parts is described as "on," "over," "under," or "next," one or more other parts may be "immediately" or "directly" used.

In describing a time relationship, for example, when the temporal order is described as "after," "subsequent," "next," or "before," a case which is not continuous may be included unless "immediately" or "right" is used.

It should be understood that, although terms such as "first," "second," and the like may be used herein to describe various components, these components are not limited by these terms. These terms are only used to distinguish one element or component from another element or component. Therefore, a first component described below could be termed a second component without departing from the scope and spirit of the present disclosure.

In describing the components of the present disclosure, terms such as "first," "second," "A," "B," "(a)," and "(b)" may be used. These terms are merely for the purpose of differentiating one component from another component, and the essence, sequence, order, or number of a corresponding element should not be limited by the terms. When a component is described as "connected," "coupled," or "linked" to another component, it may mean not only that the components are directly "connected," "coupled," or "linked" but also that they are indirectly "connected," "coupled," or "linked" through still another component.

In the present disclosure, a "display apparatus" may include a narrow-sense display apparatus such as a liquid crystal module (LCM), an organic light-emitting diode (OLED) module, or a quantum dot (QD) module which includes a display panel and a driver for driving the display panel. The display apparatus may include a set electronic device or a set device (or a set apparatus) such as a laptop computer, a television, a computer monitor, an equipment apparatus including an automotive apparatus or other type apparatuses for vehicles, or a mobile electronic device such as a smartphone or an electronic pad, which is a complete product (or a final product) including an LCM, an OLED module, a QD module, or the like.

Therefore, in the present disclosure, the display apparatus may include a narrow-sense display apparatus itself, such as an LCM, an OLED module, or a QD module and a set device which is an application product or a final consumer device including an LCM, an OLED module, a QD module, or the like.

In some cases, an LCM, an OLED module, or a QD module including a display panel, a driver, and the like may be referred to as a "narrow-sense display apparatus," and an electronic device which is a final product including an LCM, an OLED module, or a QD module may be referred to as a "set device." For example, the narrow-sense display apparatus may include a display panel, such as a liquid crystal display (LCD), an OLED, or a QD display panel and a source printed circuit board (PCB) which is a controller for driving the display panel. The set device may further include a set PCB which is a set controller electrically connected to a source PCB to control the entirety of the set device.

As a display panel used in the present aspect, any type of display panel such as an LCD panel, an OLED display panel, or a QD display panel may be used, but the present disclosure is not limited to a specific display panel which is bendable by including a flexible substrate for the OLED display panel and a back play support structure thereunder.

A shape or a size of a display panel used in a display apparatus according to aspects of the present disclosure is not limited.

More specifically, when the display panel is the OLED display panel, the display panel may include a plurality of gate lines, a plurality of data lines, and pixels formed in intersection areas of the gate lines and the data lines. The display panel may include an array including a thin film transistor which is an element for selectively applying a voltage to each pixel, an OLED layer on the array, and an encapsulation substrate or encapsulation layer disposed on the array to cover the OLED layer. The encapsulation layer may protect the thin film transistor and the OLED layer from an external impact and may prevent moisture or oxygen from permeating into the OLED layer. A layer formed on the array may include an inorganic light-emitting layer, for example, a nano-sized material layer, QDs, or the like.

In the present disclosure, FIG. 1 illustrates an exemplary OLED display panel 100 which may be integrated with components inside display apparatuses.

FIG. 1 is a plan view illustrating the display panel 100 according to an aspect of the present disclosure. FIG. 1 illustrates the exemplary OLED display panel 100 which may be integrated with components inside the display apparatuses. Referring to FIG. 1, in the OLED display panel 100, a hole CH for a camera and a sensor may be formed inside a display area DA, thereby reducing a bezel area which is a non-display area and maximizing the display area DA. A product designed to maximize a display area DA can be aesthetically preferred by maximizing an immersion level of a user.

The hole CH for the camera and the sensor may be one hole as shown in FIG. 1, but is not limited thereto. The hole CH for the camera and the sensor may be variously formed. For example, one or two holes may be formed inside the display area DA. In this case, a camera may be disposed in a first hole, and a distance sensor or a face recognition sensor and a wide-angle camera may be disposed in a second hole.

Figure 2:
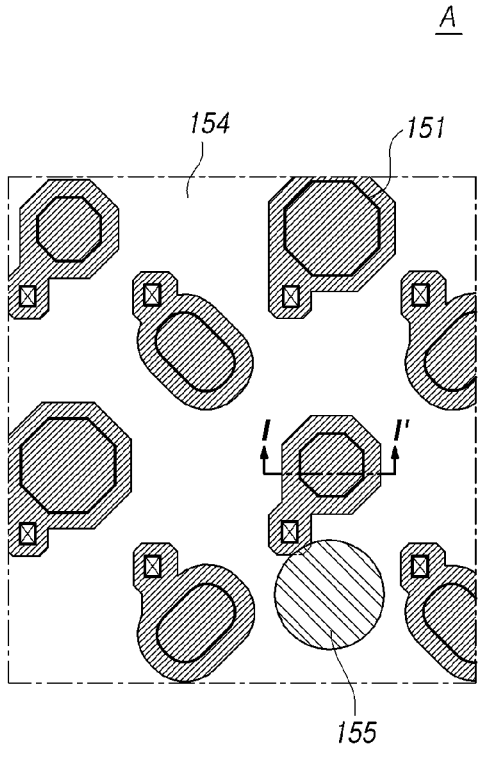
FIG. 2 is an enlarged plan view of area A of FIG. 1 which illustrates a display area.

FIG. 2 is an enlarged plan view of area A which is a portion of the display area DA of the display panel 100 of FIG. 1 and illustrates a planar shape of subpixels disposed in the display area DA.

In FIG. 2, a plurality of anodes 151 may be disposed in the display area DA, and a bank 154 may fill an area between the anodes 151. The bank 154 may be disposed to cover an edge of the anode 151 and may serve to define an emission area of the subpixel by allowing only a middle area of the anode 151 to be in contact with an organic light-emitting stack. Spacers 155 may be disposed in a portion of an area in which the bank 154 is disposed. The spacers 155 may be disposed to have a constant density in the entire display panel 100. The spacer 155 may serve to support a mask such that the mask for deposition, which covers or opens an organic layer for each subpixel, is not in direct contact with the display panel 100 when a deposition process is performed to form the organic light-emitting stack. Although FIG. 2 illustrates a PenTile-type planar structure in which the subpixels are arranged in dot shapes, the present disclosure is not limited thereto, and a real-type planar structure may also be used.

Figure 3:
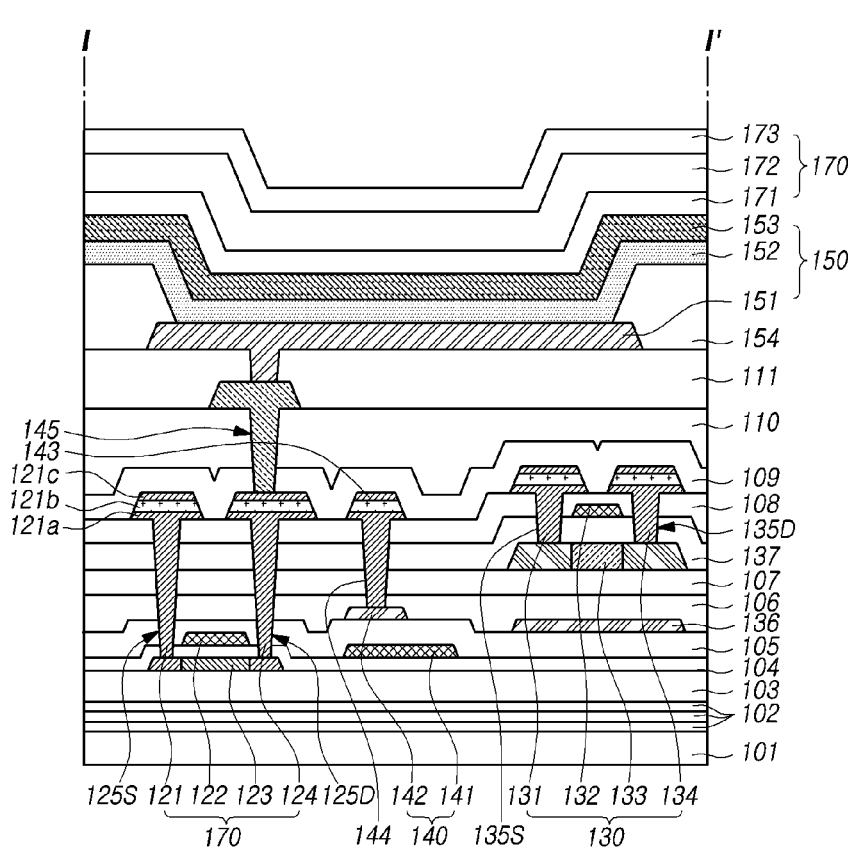
FIG. 3 is a cross-sectional view along line I-I' of FIG. 2 which illustrates a subpixel.

FIG. 3 is a cross-sectional view along line I-I' of FIG. 2 which illustrates the subpixel.

Referring to FIG. 3, a substrate 101, a multi-buffer layer 102, and a lower buffer layer 103 may be provided, and a first transistor 120 may be disposed on the lower buffer layer 103. A lower gate insulating film 104 may be disposed on a first semiconductor layer 123 constituting the first transistor 120 to insulate the first semiconductor layer 123 from a first gate electrode 122. A first lower interlayer insulating film 105 and a second lower interlayer insulating film 106 may be sequentially disposed on the first gate electrode 122, and an upper buffer layer 107 may be disposed.

The multi-buffer layer 102 may delay diffusion of moisture or oxygen permeating into the substrate 10 and may be formed by alternately stacking silicon nitride (SiN$_x$) and silicon oxide (SiO$_x$) at least one time.

The lower buffer layer 103 may protect the first semiconductor layer 123 and perform a function of blocking various types of defects introduced from the substrate. The lower buffer layer 103 may be made of a-Si, silicon nitride (SiN$_x$), silicon oxide (SiO$_x$), or the like.

The first semiconductor layer 123 of the first transistor 120 may be formed as a polycrystalline semiconductor layer and may include a channel region, a source region, and a drain region.

The polycrystalline semiconductor layer may have higher mobility than an amorphous semiconductor layer and an oxide semiconductor layer and thus may have low power consumption and excellent reliability. Due to such advantages, the polycrystalline semiconductor layer may be used for a driving transistor.

The first gate electrode 122 may be disposed on the lower gate insulating film 104 and may be disposed to overlap with the first semiconductor layer 123.

A second transistor 130 may be disposed on the upper buffer layer 107, and a light blocking layer 136 may be disposed under an area corresponding to the second transistor 130. Referring to FIG. 3, the light blocking layer 136 may be disposed on the first lower interlayer insulating film 105 in the area corresponding to the second transistor 130, and a second semiconductor layer 133 of the second transistor 130 may be disposed on the second lower interlayer insulating film 106 and the upper buffer layer 107 to overlap with the light blocking layer 136. An upper gate insulating film 137 may be disposed on the second semiconductor layer 133 to insulate a second gate electrode 132 from the second semiconductor layer 133, and then an upper interlayer insulating film 108 may be disposed on the second gate electrode 132. The first gate electrode 122 and the second gate electrode 132 may be formed as a single layer or a multi-layer made of one of molybdenum (Mo), aluminum (Al), chromium (Cr), gold (Au), titanium (Ti), nickel (Ni), neodymium (Nd), and copper (Cu), or an alloy thereof, but the present disclosure is not limited thereto.

The first and second lower interlayer insulating films 105 and 106 may be formed as inorganic films having a higher hydrogen particle content as compared with the upper interlayer insulating film 108. For example, the first and second lower interlayer insulating films 105 and 106 are made of silicon nitride (SiN$_x$) formed through a deposition process using NH$_3$ gas, and the upper interlayer insulating film 108 may be made of silicon oxide (SiO$_x$). Hydrogen particles included in the first and second lower interlayer insulating films 105 and 106 may diffuse into the polycrystalline semiconductor layer during a hydrogenation process to fill pores in the polycrystalline semiconductor layer with hydrogen. Accordingly, the polycrystalline semiconductor layer may be stabilized, thereby preventing degradation in characteristics of the first transistor 120. After an activation and hydrogenation process of the first semiconductor layer 123 of the first transistor 120, the second semiconductor layer 133 of the second transistor 130 may be formed, and in this case, the second semiconductor layer 133 may be made of an oxide semiconductor. Since the second semiconductor layer 133 is not exposed to a high-temperature atmosphere of the activation and hydrogenation process of the first semiconductor layer 123, damage to the second semiconductor layer 133 can be prevented, thereby improving reliability. After the upper interlayer insulating film 108 is disposed, a first source contact hole 125S and a first drain contact hole 125D may be formed to correspond to the source region and the drain region of the first transistor, and a second source contact hole 135S and a second drain contact hole 135d may be respectively formed to correspond to a source region and a drain region of the second transistor 130. Referring to FIG. 3, the first source contact hole 125S and the first drain contact hole 125D may be continuously formed from the upper interlayer insulating film 108 to the lower gate insulating film 104, and the second source contact hole 135S and the second drain contact hole 135D may also be formed in the second transistor 130. A first source electrode 121 and a first drain electrode 124 corresponding to the first transistor 120 and a second source electrode 131 and a second drain electrode 134 corresponding to the second transistor 130 can be formed at the same time, thereby reducing the number of times of processes of forming the source and drain electrodes of each of the first transistor 120 and the second transistor 130.

The first source and drain electrodes 121 and 124 and the second source and drain electrodes 131 and 134 may be formed as a single layer or a multi-layer made of at least one selected from among molybdenum (Mo), aluminum (Al), chromium (Cr), gold (Au), titanium (Ti), nickel (Ni), neodymium (Nd), and copper (Cu), or an alloy thereof, but the present disclosure is not limited thereto. The first source and drain electrodes 121 and 124 and the second source and drain electrodes 131 and 134 may have a three-layered structure. For example, the first source electrode 121 may include a first layer 121a, a second layer 121b, and a third layer 121c, and other source and drain electrodes may have the same structure as the first source electrode 121.

A storage capacitor 140 may be disposed between the first transistor 120 and the second transistor 130. As shown in FIG. 3, the storage capacitor 140 may be formed by overlapping with a storage lower electrode 141 and a storage upper electrode 142 with the first lower interlayer insulating film 105 interposed therebetween.

The storage lower electrode 141 may be positioned on the lower gate insulating film 104 and formed to be coplanar with the first gate electrode 122, and made of the same material as the first gate electrode 122. The storage upper electrode 142 may be electrically connected to a pixel circuit through a storage supply line 143. The storage upper electrode 142 may be formed to be coplanar with the light blocking layer 136 and made of the same material as the light blocking layer 136. The storage upper electrode 142 is exposed through a storage contact hole 144 passing through the second lower interlayer insulating film 106, the upper buffer layer 107, the upper gate insulating film 137, and the upper interlayer insulating film 108 and is connected to the storage supply line 143. Meanwhile, although the storage upper electrode 142 is spaced apart from the light blocking layer 136 as shown in FIG. 3, the storage upper electrode 142 may be connected to the light blocking layer 136 to be formed integrally with the light blocking layer 136. The storage supply line 143 may be formed to be coplanar with the first source and drain electrodes 121 and 124 and the second source and drain electrodes 131 and 134 and made of the same material as the first source and drain electrodes 121 and 124 and the second source and drain electrodes 131 and 134. Accordingly, the storage supply line 143 may be formed simultaneously with the first source and drain electrodes 121 and 124 and the second source and drain electrodes 131 and 134 through the same mask process.

A protective film 109 may be formed by depositing an inorganic insulating material such as SiNx and SiOx on an entire surface of the substrate 101 on which the first source and drain electrodes 121 and 124, the second source and drain electrodes 131 and 134, and the storage supply line 143 are formed. A first planarization layer 110 may be formed on the substrate 101 on which the protective film 109 is formed. Specifically, the first planarization layer 110 may be disposed by applying an organic insulating material such as an acrylic resin onto the entire surface of the substrate 101 on which the protective film 109 is formed.

After the protective film 109 and the first planarization layer 110 are disposed, a contact hole exposing the first source electrode 121 or the first drain electrode 124 of the first transistor 120 may be formed through a photolithography process. A connection electrode 145 made of a material including Mo, Ti, Cu, AlNd, Al, Cr, or an alloy thereof may be disposed in an area of the contact hole exposing the first drain electrode 124.

A second planarization layer 111 may be disposed on the connection electrode 145, and a contact hole exposing the connection electrode 145 may be formed in the second planarization layer 111 to arrange a light-emitting element 150 connected to the first transistor 120.

The light-emitting element 150 may include the anode 151 connected to the first drain electrode 124 of the first transistor 120, at least one organic light-emitting stack 152 formed on the anode 151, and a cathode 153 formed on the organic light-emitting stack 152.

The organic light-emitting stack 152 may include a hole injection layer, a hole transport layer, an emission layer, an electron transport layer, and an electron injection layer, and in a tandem structure in which a plurality of emission layers overlap with each other, a charge generation layer may be additionally disposed between the emission layer and the emission layer. In some cases, the emission layer may emit light having different colors for each subpixel. For example, a red emission layer, a green emission layer, and a blue emission layer may be separately formed for each subpixel. However, a common emission layer may be formed to emit white light without color discrimination for each pixel, and a color filter for discriminating colors may be separately provided. The discrimination may be classified into a red-green-blue (RGB) type (real RGB type) and a white OLED (WOLED). Each emission layer may be individually formed, but the injection layer or the transport layer may be provided as a common layer and may be equally disposed for each subpixel.

The anode 151 may be connected to the connection electrode 145 exposed through a contact hole passing through the second planarization layer 111. The anode 151 may be formed in a multi-layered structure including a transparent conductive film and an opaque conductive film having high reflection efficiency. The transparent conductive film is made of a material having a relatively large work function value, such as indium-tin-oxide (ITO) and indium-zinc-oxide (IZO), and the opaque conductive film has a single-layered or multi-layered structure including Al, Ag, Cu, Pb, Mo, Ti, or an alloy thereof. For example, the anode 151 may be formed in a structure in which a transparent conductive film, an opaque conductive film, and a transparent conductive film are sequentially stacked or in a structure in which a transparent conductive film and an opaque conductive film are sequentially stacked. The anode 151 may be disposed in the emission area provided by the bank 154 as well as on the second planarization layer 111 to overlap with a pixel circuit area in which the first and second transistors 120 and 130 and the storage capacitor 140 are disposed, thereby increasing an area for emitting light.

The organic light-emitting stack 152 may be formed by stacking the hole transport layer, the organic emission layer, and the electron transport layer on the anode 151 in that order or in the reverse order. In addition, the organic light-emitting stack 152 may further include a charge generation layer and may include first and second light-emitting stacks facing each other with the charge generation layer interposed therebetween.

The bank 154 may be formed to expose the anode 151. The bank 154 may be made of an organic material such as photoacrylic/and may include a translucent material, but the present disclosure is not limited thereto. The bank 154 may be made of an opaque material to prevent light interference between the subpixels.

The cathode 153 may be formed on an upper surface of the organic light-emitting stack 152 to face the anode 151 with the organic light-emitting stack 152 interposed therebetween. When the cathode 153 is applied to a top emission type organic light-emitting display apparatus, the cathode 153 may be formed by forming a transparent conductive thin film of ITO, IZO, or magnesium-silver (Mg—Ag).

An encapsulation layer 170 for protecting the light-emitting element 150 may be formed on the cathode 153. Since the light-emitting element 150 reacts with external moisture or oxygen due to the characteristics of an organic material of the organic light-emitting stack 152, dark-spots or pixel shrinkage may occur. In order to prevent the dark-spots or pixel shrinkage, the encapsulation layer 170 may be disposed on the cathode 153. The encapsulation layer 170 may include a first inorganic insulating film 171, a foreign material compensation layer 172, and a second inorganic insulating film 173.

A touch unit may be disposed on an upper portion on which the encapsulation layer 170 is formed. The touch unit may include a first touch planarization layer, a touch electrode, and a second touch planarization layer. The first touch planarization layer and the second touch planarization layer may be disposed to eliminate a stepped portion at a point at which the touch electrode is disposed and to allow the touch electrode to be electrically insulated well.

Figure 4:
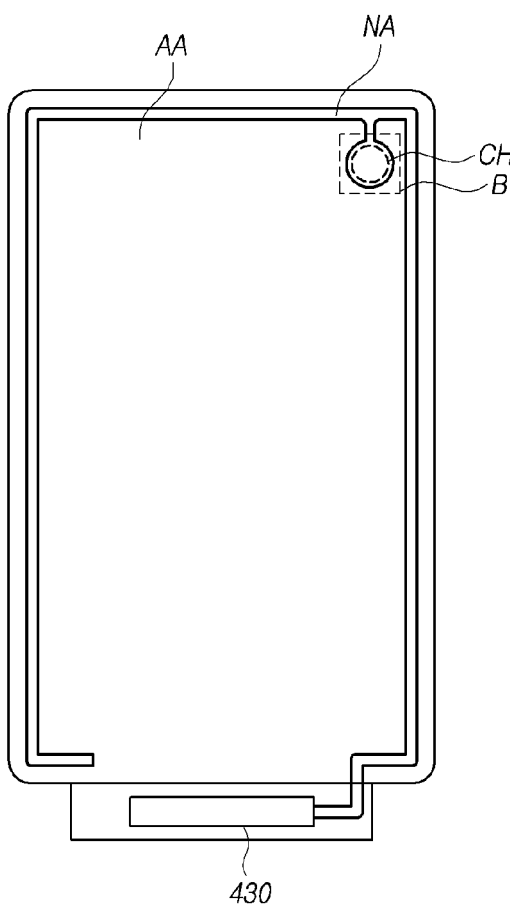
FIG. 4 is a plan view illustrating an arrangement of a crack detection unit of a display panel according to an aspect of the present disclosure.

FIG. 4 is a conceptual view illustrating a crack detection unit 400 according to an aspect of the present disclosure. Referring to FIG. 4, in a non-display area NA which is a peripheral portion of a display area AA, lines corresponding to the crack detection unit 400 may start from a crack detection pad 430 and may be disposed to surround four (upper, lower, left, and right) sides of an outer peripheral portion of the display area AA. The crack detection unit 400 may be disposed near a position at which a cut portion of a display panel 100 is formed through a laser cutting process. Accordingly, in the case of a lower surface in which a cut surface is not formed near the display area AA, the crack detection unit 400 may be disposed only in a partial section near an edge area of the display panel 100.

The crack detection unit 400 may include the plurality of lines and, for example, the crack detection unit 400 may be selected from among a first source electrode 121, a first gate electrode 122, and a first drain electrode 124 constituting a first transistor 120 or may be selected from among a second source electrode 131, a second gate electrode 132, and a second drain electrode 134 constituting a second transistor 130.

Although the crack detection unit 400 may be formed as one line in a process of forming the crack detection unit 400, the crack detection unit 400 may have a plurality of line connection structures in order to avoid or bypass other lines or structures disposed in advance in the non-display area NA. For example, in order to avoid a high potential power line, a low-potential power line, an electrostatic discharge (ESD) structure, a gate-in-panel (GIP), a plurality of lines may be disposed and a contact structure may be formed to move the plurality of lines to another layer in a cross section.

Referring to FIG. 4, the crack detection unit 400 may be disposed to surround the outer peripheral portion of the display panel 100 in two rows, and when a signal input portion and a signal output portion of the crack detection pad 430 for detecting cracks are disposed adjacent to each other, the crack detection unit 400 may start from the crack detection pad 430 and may return through an adjacent portion of a route that passes through right, upper, and left outer peripheral portions of the display panel 100 and makes a U-turn at a left lower portion. Lines constituting a kind of closed circuit may be disposed.

Arranging the crack detection unit 400 in two rows is for increasing a length of the lines used in the crack detection unit 400 by a certain level or more to constantly adjust resistance generated when cracks are detected.

Some of the lines of the crack detection unit 400 may be disposed to extend to the vicinity of a camera hole CH to thus check whether cracks are generated in the camera hole CH.

A method of checking whether cracks are generated through the crack detection unit 400 is as follows. First, the crack detection pad 430 and crack detection lines constituting the crack detection unit 400 may be disposed at the outer peripheral portion of the display panel 100. A space may be secured by arranging the crack detection pad 430 near an area, in which a flexible printed circuit board (FPCB) or a driving integrated circuit (IC) is disposed, as possible, and crack detection lines 410 may be disposed at an outermost portion of the non-display area NA of the display panel 100 and disposed closest to a cut surface of a substrate 101.

In an equipment which performs an auto probe (AP) test for a final test of the display panel 100 or a separate equipment, a certain level of power may be applied to the crack detection pad 430 to compare an input value and an output value. A degree of resistance caused by the crack detection line may be determined through a difference between the input value and the output value, and whether the crack detection line is disconnected may be checked based on the resistance. For example, when cracks are generated in the outer peripheral portion of the substrate 101 of the display panel 100, some or all of the crack detection lines may be disconnected. When some of the crack detection lines are disconnected, resistance gradually increases and output power may be lowered, and when the crack detection lines are completely disconnected, output power may approach zero. Due to such resistance-related characteristics of electricity, it is possible to simply check whether cracks are generated in the panel.

Although an example of the crack detection unit 400 having a two-row closed circuit is described in the aspect according to the present disclosure, the present disclosure is not necessarily limited thereto, and a configuration, in which crack detection lines disposed in the camera hole CH are separately provided and a plurality of crack detection pads 430 corresponding thereto are disposed, may also be included in the scope of the present disclosure.

Figure 5:
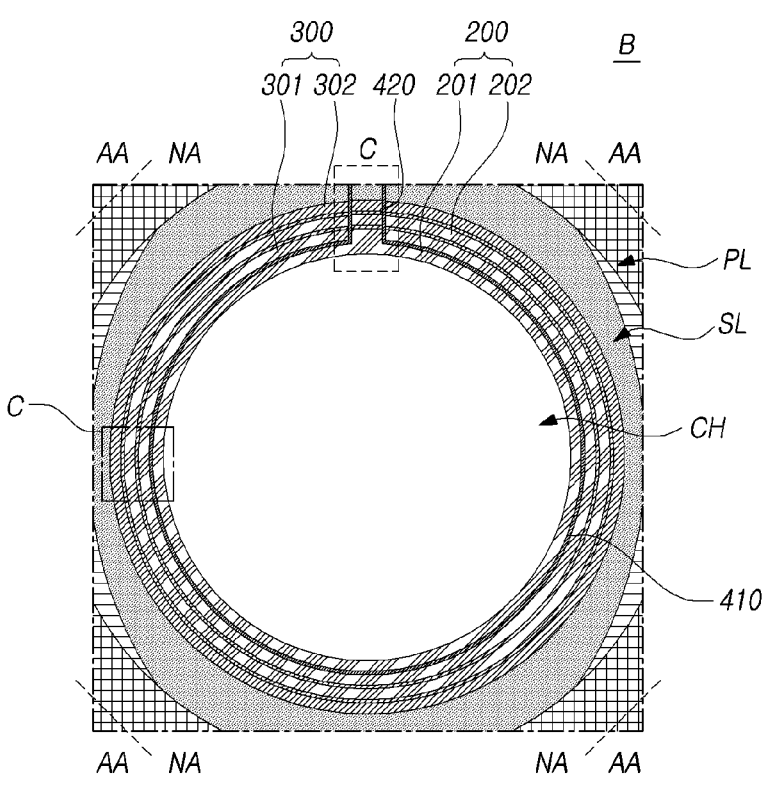
FIG. 5 is an enlarged plan view of area B of FIG. 4 which illustrates a peripheral portion of a camera hole.

FIG. 5 is an enlarged plan view of area B corresponding to a camera hole area CHA of FIG. 1. Referring to FIG. 5, the camera hole CH for arranging a large-sized camera may be formed in a central portion, and a camera module may be disposed therein. A dam structure 300, a cut-out structure 200, a crack detection unit 400, and the like may be disposed near the circular camera hole CH. The camera hole CH may be formed by a laser in a panel completion operation. A non-display area NA may be positioned between the camera hole CH and a display area AA, and a high potential power line PL, a gate line SL, and the like may be disposed in the non-display area NA.

Referring to FIG. 5, the dam structure 300 may include a first dam 301 and a second dam 302, and the cut-out structure 200 may include a first cut-out part 201 and a second cut-out part 202. The first cut-out part 201, a crack detection line 410 of the crack detection unit 400, the first dam 301, the second cut-out part 202, and the second dam 302 may be sequentially disposed from the camera hole CH.

In general, a dam structure prevents a foreign material compensation layer 172, which is a part of an encapsulation layer at the outer peripheral portion of the display panel 100, from flowing to an end of the outer peripheral portion of the display panel 100, thereby aiming to maintain an adhesive force between an upper substrate and a lower substrate constituting the display panel 100.

In order to prevent the foreign material compensation layer 172 of an encapsulation layer 170, which protects a light-emitting element 150, from permeating or leaking into the camera hole CH, the dam structure 300 near the camera hole CH may also be formed as a plurality of structures such as the first dam 301 and the second dam 302.

In the present disclosure, two dams are provided, but the present disclosure is not limited thereto. An additional dam may be disposed according to an arrangement of a space.

Referring to FIG. 5, the first cut-out part 201 and the second cut-out part 202 may be disposed near the first dam 301 and the second dam 302. The first cut-out part 201 and the second cut-out part 202 may be disposed to protect the light-emitting element 150 in the display area AA from moisture or oxygen that may flow from the camera hole CH.

An organic light-emitting stack 152 for the light-emitting element 150 may be deposited on an entire surface of the display panel 100 and may also be uniformly deposited near the camera hole CH. The organic light-emitting stack 152 may have high reactivity and communicability with respect to moisture and oxygen due to the characteristics of an organic material and thus may deliver moisture and oxygen to the light-emitting element 150 in the display area AA. In order to prevent the delivering of moisture and oxygen, the first and second cut-out parts 201 and 202 may allow the organic light-emitting stack 152 to be partially cut off. In the present disclosure, two cut-off structures are described, but the present disclosure is not limited thereto.

Referring to FIG. 5, the crack detection unit 400 may be disposed between the first cut-out part 201 and the first dam 301. The camera hole CH may be formed in the substrate 101 of the display panel 100 to arrange a camera lens. A precision cutting process using a laser may be performed on the substrate 101 to form the camera hole CH, and in this case, the laser may cause microcracks in the substrate 101. Microcracks generated in a cut surface of the camera hole CH may be gradually expanded by stress accumulated as a subsequent module process is performed.

Such cracks may expand from the non-display area NA to an adjacent display area AA. Due to the expansion of cracks, external oxygen or moisture may reach the light-emitting element 150 in the display area AA through the cracks, and the light-emitting element 150 having organic characteristics may react with oxygen or moisture to cause a pixel shrinkage or dark spot phenomenon in a pixel in a specific area, thereby causing display defects. In order to prevent the expansion of cracks, the crack detection unit 400 for preventing the expansion of cracks may be disposed near the camera hole CH.

The crack detection unit 400 may be formed in a structure in which a portion of an inorganic film, in which cracks easily expand, is removed in order to prevent the expansion of cracks generated in the cut surface of the camera hole CH.

All of the first cut-out part 201, the first dam 301, the second cut-out part 202, and the second dam 302 may be disposed in a closed loop shape around the camera hole CH. This is to prevent the penetration of oxygen and moisture at a certain distance along the cut surface of the camera hole CH and to prevent the foreign material compensation layer 172 of the encapsulation layer 170 from overflowing into the camera hole CH.

However, the crack detection unit 400 may have a circular arrangement shape around the camera hole CH but does not have a closed loop shape. Since a section through which a detection signal input from a crack detection pad 430 is input and output is required, the crack detection unit 400 includes a connection line 420 passing through the first cut-out part 201, the first dam 301, the second cut-out part 202, and the second dam 302 in a direction from a lower portion thereof toward the non-display area NA. Due to the arrangement of the connection line 420, the crack detection unit 400 does not have a closed loop structure in the camera hole CH.

Although a light-emitting element 150 and a pixel circuit in an area corresponding to an arrangement of the camera hole area CHA are removed, light-emitting elements 150 and pixel circuits disposed at upper, lower, left, and right sides of the camera hole area CHA should be electrically connected. To this end, in the non-display area NA near the camera hole area CHA, a high potential power line PL, a gate line SL, and the like may be disposed to bypass the camera hole area CHA so as to be connected vertically and laterally.

Figure 6:
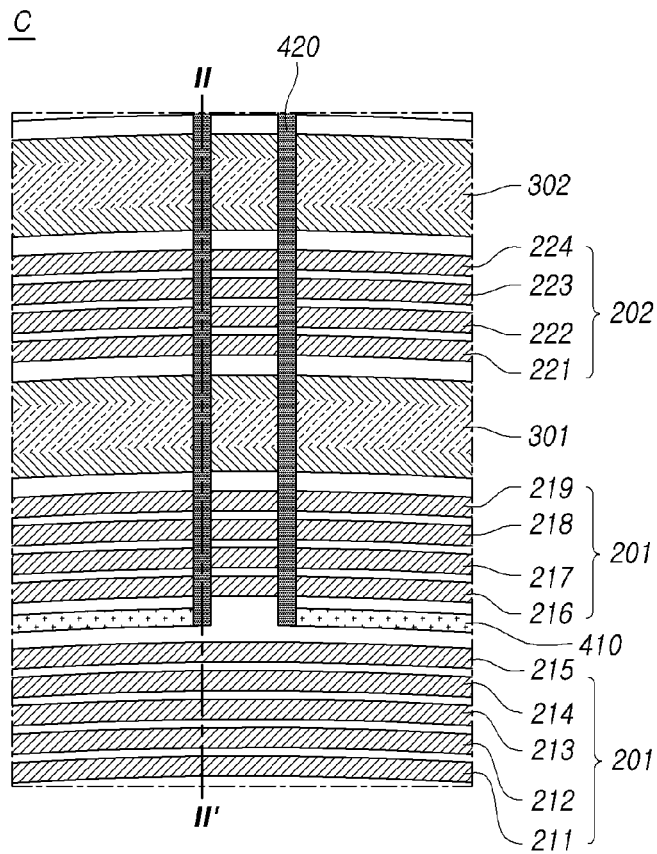
FIG. 6 is an enlarged plan view of area C of FIG. 5 which illustrates the peripheral portion of the camera hole.

FIG. 6 is an enlarged plan view of area C in the camera hole area CHA of FIG. 5. Referring to FIG. 6, the first cut-out part 201 may be disposed between the first dam 301 and the camera hole CH, and the second cut-out part 202 may be disposed between the first dam 301 and the second dam 302.

The first cut-out part 201 may include a first structure 211, a second structure 212, a third structure 213, a fourth structure 214, a fifth structure 215, a sixth structure 216, a seventh structure 217, an eighth structure 218, and a ninth structure 219. The second cut-out part 202 may include a tenth structure 221, an eleventh structure 222, a twelfth structure 223, and a thirteenth structure 224.

Although FIG. 6 illustrates that there are nine structures in the first cut-out part 201 and four structures in the second cut-out part 202, the present disclosure is not necessarily limited thereto, and various numbers of cut-out parts may be provided.

Referring to FIG. 6, the crack detection unit 400 may be formed in an area in which the structures of the first cut-out part 201 are disposed. For example, the crack detection unit 400 may be disposed between the fifth structure 215 and the sixth structure 216. The crack detection unit 400 may be disposed between the fifth structure 215 and the sixth structure 216, which are not far from the cut surface of the camera hole CH, thereby detecting cracks, which may be generated in the cut surface, at the beginning when the cracks do not expand to the first dam 310.

Referring to FIG. 6, the crack detection unit 400 may include a crack detection line 410 and the connecting line 420 near the camera hole CH. The crack detection line 410 may have a circular planar shape along the camera hole CH, but a disconnected portion may be present in a partial section thereof. The crack detection line 410 may be electrically connected to the connection line 420 at the corresponding disconnected portion.

The connection line 420 may extend to the non-display area NA to be connected to the crack detection pad 430.

Figure 7:
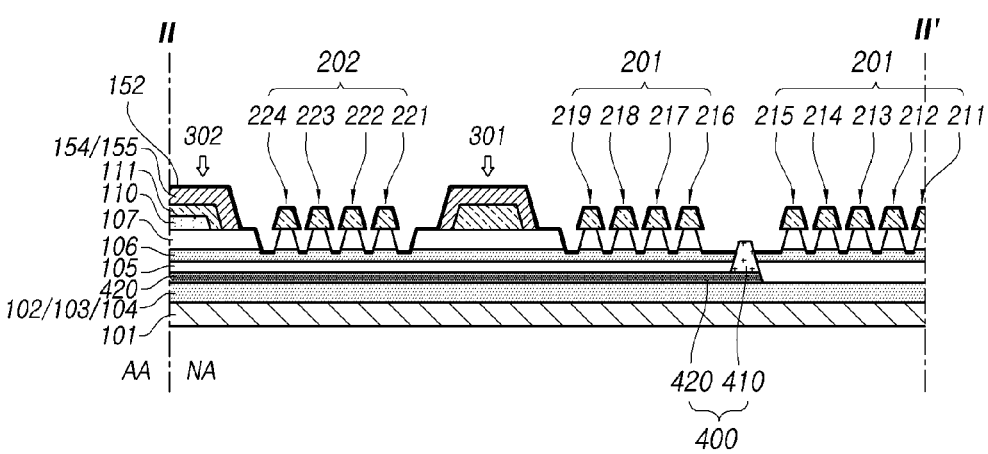
FIG. 7 is a cross-sectional view along line II-IP' of FIG. 6 which illustrates a camera hole area.

FIG. 7 is a cross-sectional view illustrating a cross section taken along line II-IF of FIG. 6. Referring to FIG. 7, it can be confirmed that there is the substrate 101 of the display panel 100, and a plurality of inorganic films are disposed on the substrate 101. As the plurality of inorganic films, for example, a multi-buffer layer 102, a lower buffer layer 103, and a lower gate insulating film 104 may be provided, and a first lower interlayer insulating film 105, a second lower interlayer insulating film 106, and an upper buffer layer 107 may be sequentially disposed.

A first planarization layer 110 and a second planarization layer 111 may be disposed on the plurality of inorganic films, and a bank 154 and a spacer 155 may be sequentially disposed. The organic light-emitting stack 152 may be deposited on an entire surface to be disposed on the bank 154 and the spacer 155.

Regarding a cut surface along line it can be seen that the camera hole CH is close to point II' and the display area AA is close to area II. Regarding the cut surface along line in order to cut off the organic light-emitting stack 152 which can become a moisture permeation path on the cut surface of the camera hole CH, the structures of the first cut-out part 201 may be formed in two stages of an upper structure part and a lower structure part. Specifically, the upper structure part may be disposed such that a cross section thereof has a trapezoidal shape with a positive tapered shape, and the lower structure part may be disposed such that a side surface thereof has a positive tapered shape or a rectangular shape with an almost vertical constant height.

Since a difference in width or breadth occurs between a lower surface of the upper structure part and an upper surface of the lower structure part, which are points at which the upper structure part and the lower structure part meet each other, an undercut structure may be formed on the lower surface of the upper structure part. The lower structure part may include the second lower interlayer insulating film 106 and the upper buffer layer 107, and the upper structure part may include the first planarization layer 110 and the second planarization layer 111.

The upper structure part may be made of an organic material to form the undercut structure. The organic light-emitting stack 152 may be deposited on the entire surface of the display panel 100 using straightness during deposition, but the organic light-emitting stack 152 may be cut off because the organic light-emitting stack 152 cannot be formed on the lower surface of the upper structure part of the cut-out part due to an undercut shape of the upper structure part of the cut-out part.

The first cut-out part 201 and the second cut-out part 202 may include the plurality of structures, thereby preventing oxygen and moisture from permeating through the organic light-emitting stack 152. Although it is described that the first cut-out part 201 has more structures than the second cut-out part 202, the present disclosure is not necessarily limited thereto, and various changes may be applied.

Referring to FIG. 7, the first dam 301 and the second dam 302 are illustrated and are formed in a separation space between the first cut-out part 201 and the second cut-out part 202 and inside the second cut-out part 202, respectively, thereby forming a kind of wall. Although not shown in FIG. 7, the foreign material compensation layer 172 of the encapsulation layer 170 may fill a space between the first dam 301 and the second dam 302. The first dam 301 or the second dam 302 aims to prevent the foreign material compensation layer 172 of the encapsulation layer 170 from overflowing to the camera hole CH and contaminating the camera hole CH.

The crack detection unit 400 is disposed between the fifth structure 215 and the sixth structure 216 of the first cut-out part 201, thereby detecting cracks that may be generated in the cut surface of the camera hole CH. The crack detection unit 400 may be formed by forming the connection line 420 on the multi-buffer layer 102, the lower buffer layer 103, and the lower gate insulating film 104 among the plurality of inorganic films disposed on the substrate 101 of the display panel 100, forming the first lower interlayer insulating film 105 and the second lower interlayer insulating film 106 on the connection line 420, and arranging the crack detection line 410 in a space in which a partial area is removed.

In general, the substrate 101 may be perforated using a laser to form the camera hole CH. The laser may radiate in a circular or elliptical shape along a shape of the camera hole CH, and all areas on the substrate in addition to the substrate 101 may be removed through laser radiation.

There may be a difference between the actual camera hole CH and a laser irradiation area, and for example, the laser irradiation area in the camera hole CH may be an area at about 100 μm inside the camera hole CH. Only when there is a difference between the laser irradiation area and the camera hole CH, an insulating layer of the camera hole CH may not be damaged during laser radiation.

As a laser, a picosecond laser or a femtosecond laser may be used, but the present disclosure is not limited thereto. A laser uses light that is induced and emitted by amplifying light generated when energy is applied to a specific material. The laser has the same characteristics as radio waves and has characteristics of monochromatic light and directivity and thus is used for communication, medical, and industrial purposes.

When a laser is used, a pattern can be formed on a desired part, or a specific part can be easily removed. A laser is for forming or removing a pattern using energy, and when laser energy radiates onto a subject, thermal energy melts the subject to form a pattern. As a laser radiation time increases, a thermal effect may occur in which heat is transmitted to the vicinity of a portion at which a pattern is formed. Due to the thermal effect, heat may be accumulated around a laser irradiation area of the subject, and even a surrounding area greater than a set pattern may be burned or deformed by the heat.

Due to such characteristics of a laser, when an area onto which the laser radiates overlaps with an insulating film or is adjacent to the insulating film, thermal energy of the laser may also cause deformation of the insulating film. Cracks may be generated due to the deformation of the insulating film, and the cracks may propagate through the insulating film to cause delamination, which may cause penetration of moisture and oxygen. For example, in order to prevent deformation or delamination of insulating films such as the multi-buffer 102, the lower buffer layer 103, the first lower interlayer insulating film 105, the second lower interlayer insulating film 106, the upper buffer layer 107, and the upper interlayer insulating film 108, all the insulating layers may be removed at a distance of about 100 μm from a laser irradiation position.

When all the insulating layers are removed, side surfaces of the substrate 101 and the insulating layers may be exposed, but a first inorganic insulating film 171 and a second inorganic insulating film 173 of the encapsulation layer 170 may cover the side surfaces.

Cracks generated when the substrate 101 is cut using a laser have characteristics that are easily propagated through an inorganic film. Moisture and oxygen have characteristics that are delivered by reacting with the organic light-emitting stack 152, but cracks may be easily propagated through non-flexible and hard inorganic films. The crack detection unit 400 may be designed based on such crack propagation characteristics.

An exposed area of the substrate 101 may be formed by removing the multi-buffer layer 102, the lower buffer layer 103, the lower gate insulating film 104, the first lower interlayer insulating film 105, and the second lower interlayer insulating film 106 among the plurality of inorganic films disposed on the substrate 101, and then, the first planarization layer 110 or the second planarization layer 111 may be disposed to cover the exposed area of the substrate and side exposed portions of the plurality of inorganic films.

When the substrate 101 is cut using a laser, stress concentration may occur in the first lower interlayer insulating film 105 or the second lower interlayer insulating film 106 which is positioned on an uppermost layer among the plurality of inorganic films. Therefore, the crack detection line 410 of the crack detection unit 400 is disposed at a position at which a portion of the first lower interlayer insulating film 105 or the second lower interlayer insulating film 106 is removed, thereby sensitively responding the expansion of cracks.

The crack detection line 410 constituting the crack detection unit 400 may be made of the same material as the second gate electrode 132 through the same process as the second gate electrode 132, and the connection line 420 may be made of the same material as the first gate electrode 122 through the same process as the first gate electrode 122.

The crack detection line 410 may be made of the same material as the first gate electrode 122 or the second gate electrode 132 and thus may be formed as a single layer or a multi-layer made of at least one selected from among molybdenum (Mo), aluminum (Al), chromium (Cr), gold (Au), titanium (Ti), nickel (Ni), neodymium (Nd), and copper (Cu), or an alloy thereof, but the present disclosure is not limited thereto.

The crack detection line 410 may have a line width of about 5 μm to 6 μm and may be disposed between the structures of the first cut-out part 201. The line width of the crack detection line 410 may be selected in consideration of a size of the structure of the first cut-out part 201 and crack detection sensitivity. The structure of the first cut-out part 201 may have a width of about 10 μm, and a design width of the crack detection line 410 may be less than that of the structure of the first cut-out part 201 for preventing penetration of moisture and oxygen. When the line width of the crack detection line 410 is wide, there is an advantage of lowering resistance. However, considering an overall design of the crack detection line 410 disposed on the display panel 100, the wide line width may be unnecessary. The crack detection line 410 may also be disposed between the structures of the second cut-out part 202 but may be disposed in the first cut-out part 201 as much as possible in order to initially detect whether cracks are generated.

Figure 8:
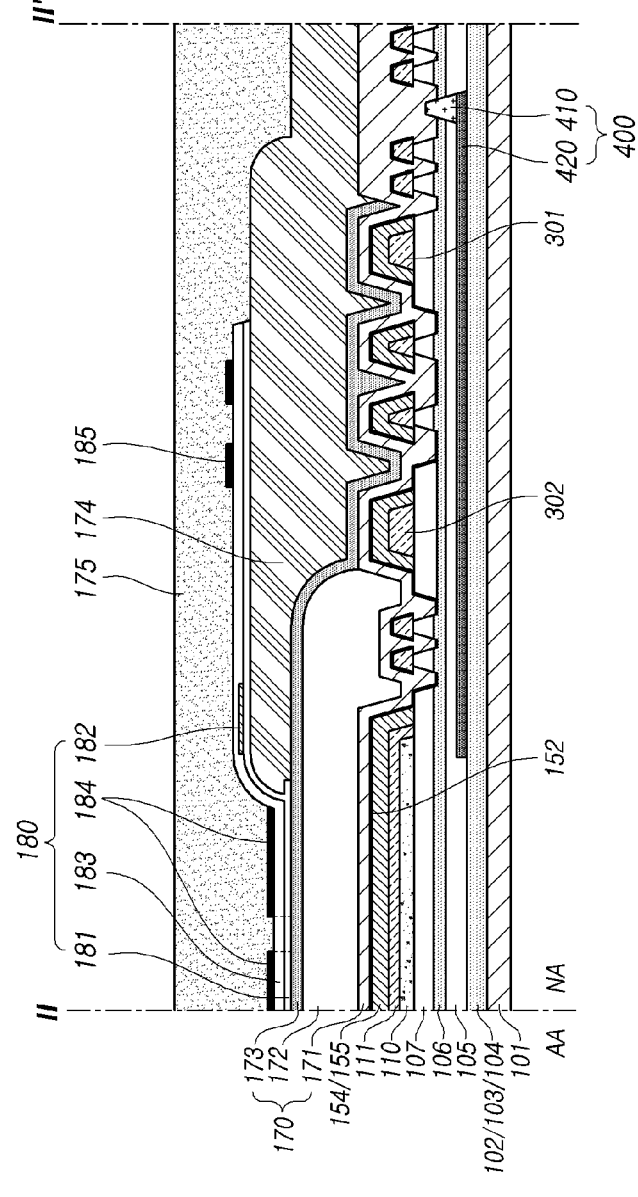
FIG. 8 is a cross-sectional view illustrating an arrangement of a touch panel and the like at a peripheral portion of a camera hole according to an aspect of the present disclosure.

FIG. 8 is a cross-sectional view illustrating the cut surface along line II-IF of FIG. 6 to which a touch sensor unit 180, which may be added to a display panel 100, is added according to an aspect of the present disclosure. Referring to FIG. 8, the crack detection unit 400 shown in FIG. 7 may be disposed on a substrate 101 of a display panel 100, and as in that shown in FIG. 7, cut-out parts, a first dam 301, a second dams 302, and the like may be disposed.

An encapsulation layer 170 may be disposed on the cut-out parts and the dams, and a touch buffer 181, a first touch electrode 182, a touch interlayer insulating film 183, and a second touch electrode 184 may be sequentially disposed on the encapsulation layer 170.

A first pack 174 may be thickly disposed on the encapsulation layer 170 in an area, in which a first cut-out part 201 or a second cut-out part 202 is disposed, near an area of a camera hole CH. The touch buffer 181 and the touch interlayer insulating film 183 may be disposed to extend and overlap with the first pack 174. A touch sensor crack detection electrode 185 made of the same material as the second touch electrode 184 may be disposed on the touch buffer 181 and the touch interlayer insulating film 183 which overlap with the first pack 174.

A second pack 175 may be disposed on the touch sensor crack detection electrode 185 to planarize the display panel 100. The touch sensor crack detection electrode 185 may be disposed to detect cracks that may be generated at a position near the substrate 101 that is a lower layer of the display panel as well as cracks that may be generated near the touch sensor unit 180 that is an upper layer of the display panel 100, thereby sorting defects in advance.

Although a display apparatus according to an aspect of the present disclosure has been described based on the fact that a substrate corresponding to a camera hole CH is removed by a laser, the present disclosure is not necessarily limited thereto, and a component of the substrate or only a portion of the substrate may be removed.

A display apparatus according to an aspect of the present disclosure may include an LCD, a field emission display device (FED), an OLED display device, and a QD display device.

The display apparatus according to the aspect of the present disclosure may include a set electronic device/apparatus or a set device (or a set apparatus) such as a laptop computer, a television, a computer monitor, an equipment display apparatus including an automotive display apparatus or another type apparatuses for vehicles, or a mobile electronic device/apparatus such as a smartphone or an electronic pad, which is a complete product (or a final product) including an LCM, an OLED module, or the like.

A display apparatus according to an aspect of the present disclosure described above may be briefly described again as follows.

A display apparatus according to an aspect of the present disclosure may include a substrate including a display area, a camera hole, and a non-display area, at least one cut-out part and at least one dam disposed in the non-display area, a plurality of insulating films disposed on the substrate and disposed under a light-emitting element, the cut-out part, and the dam, and a crack detection unit disposed between the at least one cut-out part and the camera hole. Here, the above-described non-display area may be positioned between the display area and the camera hole.

In the display apparatus according to the aspect of the present disclosure, the crack detection unit may include a crack detection line and a connection line. Here, the crack detection unit is also referred to as a crack detection structure.

In the display apparatus according to the aspect of the present disclosure, the plurality of insulating films may include a gate insulating film, a first interlayer insulating film, a second interlayer insulating film, and the like.

In the display apparatus according to the aspect of the present disclosure, the crack detection line may be disposed in an area in which a portion of the first interlayer insulating film or the second interlayer insulating film is removed. For example, the first interlayer insulating film or the second interlayer insulating film includes at least one opening, and at least one crack detection line may be disposed in the at least one opening of the first interlayer insulating film or the second interlayer insulating film.

In the display apparatus according to the aspect of the present disclosure, the connection line may be disposed between the gate insulating film and the first interlayer insulating film. Here, the connection line may also be referred to as a connection electrode or a connection pattern.

In the display apparatus according to the aspect of the present disclosure, the crack detection line may have a circular planar shape excluding a partial section thereof. For example, the crack detection line may have a circular planar shape along the camera hole, a disconnected portion may be present in the partial section. The crack detection line may be electrically connected to the connection line at the corresponding disconnected portion. For example, a shape of the crack detection line may be determined according to a shape of the camera hole, and when the shape of the camera hole is a circular, oval, or polygonal shape (for example, a quadrangular, hexagonal, or octagonal shape), the shape of the crack detection line may also be a circular, oval, or polygonal shape (for example, a quadrangular, hexagonal, or octagonal shape).

In the display apparatus according to the aspect of the present disclosure, the connection line may be in electrical contact with the crack detection line and may be disposed to overlap with the at least one cut-out part or the at least one dam.

In the display apparatus according to the aspect of the present disclosure, the connection line may extend to be perpendicular to the crack detection line, the at least one cut-out part, and the at least one dam.

A display apparatus according to an aspect of the present disclosure may include a substrate including a non-display area disposed between a camera hole and a display area, a touch sensor unit disposed to correspond to the display area, a touch crack detection electrode disposed to correspond to the non-display area, and a crack detection unit disposed to correspond to the non-display area. Here, the touch crack detection electrode is also referred to as a touch sensor crack detection electrode.

In the display apparatus according to the aspect of the present disclosure, the crack detection unit may include a crack detection line and a connection line.

In the display apparatus according to the aspect of the present disclosure, the crack detection line and the touch crack detection electrode may not overlap with each other, and the connection line and the touch crack detection electrode may be disposed to overlap with each other.

The display apparatus according to the aspect of the present disclosure may further include one or more cut-out parts and at least one dam which are disposed in the non-display area, and the crack detection line may be disposed between the one or more cut-out parts.

In the display apparatus according to the aspect of the present disclosure, the connection line may be disposed under the one or more cut-out parts and the at least one dam to overlap with the one or more cut-out parts and the at least one dam. Here, the connection line may also be referred to as a connection electrode or a connection pattern.

The display apparatus according to the aspect of the present disclosure may further include a pack layer between the connection line and the touch crack detection electrode. Here, the pack layer may include a first pack.

In the display apparatus according to the aspect of the present disclosure, the non-display area may further include a crack detection pad electrically connected to the connection line.

The features, structures, and effects described above in the examples of the present application are included in at least one example of the present application, but the present disclosure is not limited to only one example. Furthermore, the features, structures, and effects described in at least one example of the present application may be implemented through combinations or modifications of other examples by those skilled in the art to which the present application belongs. Therefore, content associated with the combinations and modifications should be construed as being within the scope of the present application.

It will be apparent to those skilled in the art to which the present application belongs that the present application is not limited to the above-described aspects and the accompanying drawings and various substitutions, modifications, and variations can be made without departing from the spirit or scope of the present application. Thus, the scope of the present application is defined by the claims described below, and the present application should be construed to cover all modifications or variations induced from the meaning and scope of the appended claims and their equivalents.

What is claimed is:

1. A display apparatus comprising:
a substrate including a display area, a camera hole, and a non-display area between the display area and the camera hole;
at least one cut-out part and at least one dam disposed in the non-display area;
a plurality of insulating films disposed on the substrate and disposed under a light-emitting element, the cut-out part, and the at least one dam; and
a crack detection unit disposed between the at least one cut-out part and the camera hole,
wherein the crack detection unit comprises a crack detection line and a connection line, and wherein the connection line is disposed under the at least one cut-out part and the at least one dam to overlap with the at least one cut-out part and the at least one dam.

2. The display apparatus of claim 1, wherein the plurality of insulating films comprise a gate insulating film, a first interlayer insulating film and a second interlayer insulating film.

3. The display apparatus of claim 2, wherein the crack detection line is disposed in an area where a portion of the first interlayer insulating film or the second interlayer insulating film is removed.

4. The display apparatus of claim 2, wherein the connection line is disposed between the gate insulating film and the first interlayer insulating film.

5. The display apparatus of claim 1, wherein the crack detection line has a circular planar shape excluding a partial section thereof.

6. The display apparatus of claim 5, wherein the connection line is in electrical contact with the crack detection line.

7. The display apparatus of claim 6, wherein the connection line extends to be perpendicular to the crack detection line, the at least one cut-out part and the at least one dam.

8. A display apparatus comprising:
a substrate including a non-display area disposed between a camera hole and a display area;
one or more cut-out parts and at least one dam disposed in the non-display area;
a touch sensor unit disposed to correspond to the display area;
a touch crack detection electrode disposed to correspond to the non-display area; and
a crack detection unit disposed to correspond to the non-display area,
wherein the crack detection unit comprises a crack detection line and a connection line, and
wherein the connection line is disposed under the one or more cut-out parts and the at least one dam to overlap with the one or more cut-out parts and the at least one dam.

9. The display apparatus of claim 8, wherein the crack detection line and the touch crack detection electrode do not overlap with each other; and
wherein the connection line and the touch crack detection electrode are disposed to overlap with each other.

10. The display apparatus of claim 8,
wherein the crack detection line is disposed between the one or more cut-out parts.

11. The display apparatus of claim 9, further comprising a pack layer disposed between the connection line and the touch crack detection electrode.

12. The display apparatus of claim 11, further comprising a crack detection pad electrically connected to the connection line in the non-display area.

* * * * *